United States Patent
Suzuki et al.

(10) Patent No.: US 6,223,686 B1
(45) Date of Patent: May 1, 2001

(54) APPARATUS FOR FORMING A THIN FILM BY PLASMA CHEMICAL VAPOR DEPOSITION

(75) Inventors: Masayasu Suzuki; Noritaka Akita; Yoshihiro Hashimoto, all of Kanagawa (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/474,849

(22) Filed: Dec. 30, 1999

Related U.S. Application Data

(62) Division of application No. 09/019,769, filed on Feb. 6, 1998, now Pat. No. 6,060,131.

(51) Int. Cl.⁷ .............................. C23C 16/00; H05H 1/00
(52) U.S. Cl. ................. 118/723 MW; 156/345; 118/723 E; 118/723 I; 118/723 AN
(58) Field of Search ................... 118/723 MW, 118/723 E, 723 AN, 723 I; 156/345

(56) References Cited

U.S. PATENT DOCUMENTS

| | | |
|---|---|---|
| 4,970,435 | 11/1990 | Tanaka et al. . |
| 5,160,397 | 11/1992 | Doki et al. . |
| 5,221,416 | * 6/1993 | Kishi et al. ................ 156/345 |
| 6,030,667 | * 2/2000 | Nakagawa et al. ......... 118/723 I |

* cited by examiner

Primary Examiner—Gregory Mills
Assistant Examiner—P. Hassanzadeh
(74) Attorney, Agent, or Firm—Coudert Brothers

(57) ABSTRACT

A substrate to be coated with a thin film is placed inside a vacuum chamber, an ECR plasma is generated and introduced into the vacuum chamber by means of a specified magnetic field generated inside the vacuum chamber and a reaction gas, as well as an inert gas, is introduced into the vacuum chamber while a negative DC voltage superposed with a high-frequency pulse with frequency 25–250 kHz is applied to the substrate by a voltage applying device such that the voltage of the substrate reaches a positive value instantaneously. The frequency of the superposed pulse is selected by using an ammeter to determine an optimum frequency for minimizing the load current of the voltage-applying circuit.

3 Claims, 2 Drawing Sheets

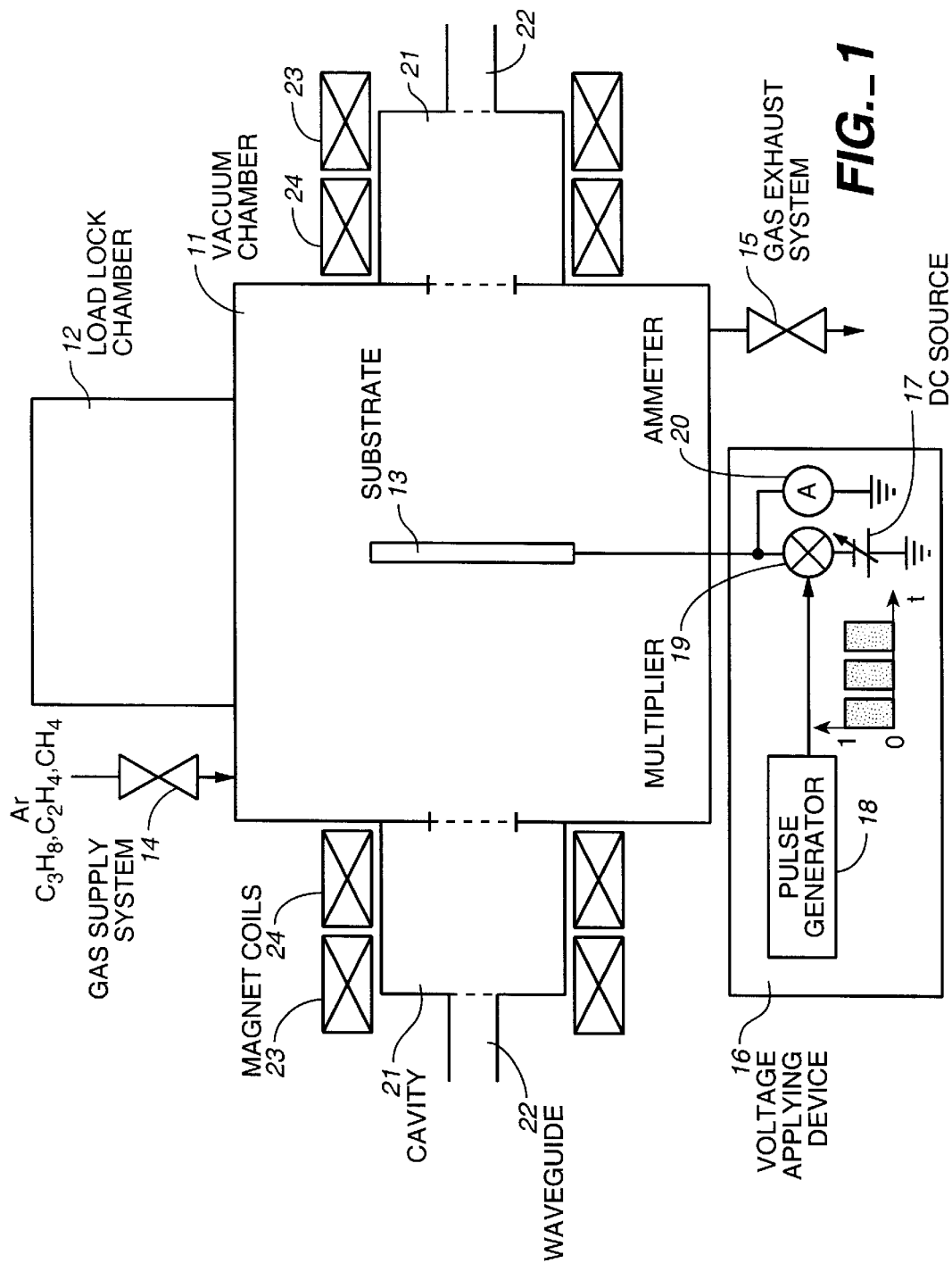
FIG._1

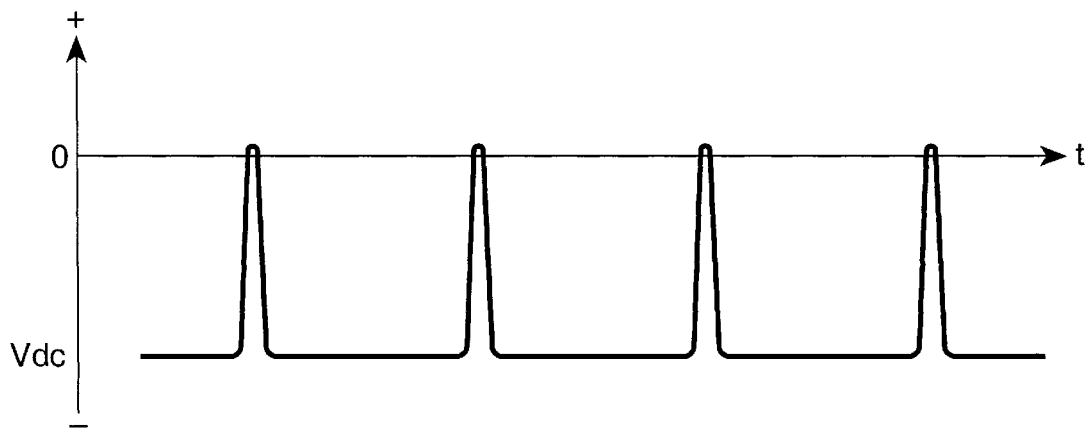
FIG._2
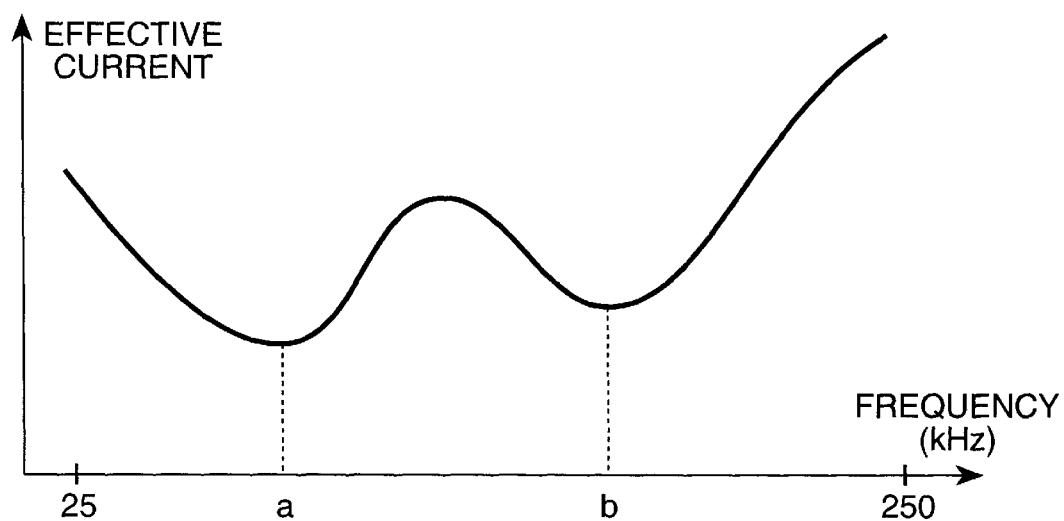
FIG._3

APPARATUS FOR FORMING A THIN FILM BY PLASMA CHEMICAL VAPOR DEPOSITION

This is a division of application Ser. No. 09/019,769, filed Feb. 6, 1998 now U.S. Pat. No. 6,060,131.

BACKGROUND OF THE INVENTION

This invention relates to an apparatus for forming a thin film and more particularly to such an apparatus by plasma chemical vapor deposition (CVD) suitable for use in the production process for a magnetic disc serving as a memory medium for a hard disc memory device.

The magnetic disc for a hard disc memory device is usually produced by forming a magnetic layer on the surface of a disc such as a glass disc and further providing a protective layer thereon. An apparatus for forming a thin film by plasma CVD may be used to form a carbon film as a protective layer on both surfaces of a disc at the same time. The carbon film comprises amorphous carbon, and such a film formed by plasma CVD is very hard and has superior characteristics such as resistance against abrasion, corrosion, peeling, voltages and insulation. Thus, carbon films are most suitable as a protective layer for a magnetic disc. The hardness of these films can be controlled by adjusting the bias voltage applied to the substrate at the time of the plasma CVD.

With a prior art apparatus for forming a thin film by plasma CVD, however, a negative charge-up may take place when a bias voltage is applied to the substrate, resulting in an abnormal discharge and causing particles to be emitted from the chamber walls and to become attached to the substrate. There may also occur peeling on the substrate surfaces.

SUMMARY OF THE INVENTION

It is therefore an object of this invention to provide an improved apparatus for forming a thin film adapted to optimize the bias voltage to be applied to the substrate such that a plasma can be produced in a stable manner and that no abnormal discharge will take place.

An apparatus embodying this invention, with which the above and other objects can be accomplished, may be characterized as comprising a vacuum chamber inside which the substrate is disposed, ECR plasma generating means connected to this vacuum chamber, field generating means for generating a specified magnetic field inside the vacuum chamber, gas supply means for introducing a reaction gas and an inert gas into the vacuum chamber, and a voltage applying device for applying to the substrate a negative DC voltage superposed with a high-frequency pulse with frequency 25–250 kHz. The frequency of the superposed pulse is selected by using an ammeter to measure the load current of the voltage applying device to thereby determine an optimum frequency for minimizing the load current of the voltage applying device, and the voltage of the substrate is not constantly negative but reaches a positive value instantaneously.

Thus, electrons are pulled towards the substrate and charge the outer surface of the substrate negatively, thereby improving the efficiency of attracting plasma ions to its surface. Although a plasma normally becomes unstable when a voltage superposed with a pulse is applied, the frequency of the pulse to be superposed is selected by monitoring the load current of the voltage applying device to determine an optimum frequency at which the plasma impedance reaches a maximum.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a block diagram of an apparatus embodying this invention;

FIG. 2 is a waveform diagram of the bias voltage applied to the substrate; and

FIG. 3 is a graph which shows the relationship between the pulse frequency and the effective load current.

DETAILED DESCRIPTION OF THE INVENTION

The invention is described next by way of an embodiment thereof with reference to drawings. FIG. 1 is a schematic block diagram of an apparatus embodying this invention, adapted to form a thin film on both surfaces of a disc at the same time. In what follows, the apparatus of FIG. 1 will be explained as one for the production of a magnetic disc of a hard disc memory device.

Numeral 11 indicates a vacuum chamber which is initially evacuated and in a vacuum condition, containing therein a substrate 13 on which thin films are intended to be formed. The substrate 13 is transported into and out of the vacuum chamber 11 through a load lock chamber 12 provided at one side of the vacuum chamber 11. A gas supply system 14 including gas containers and control valves is connected to the vacuum chamber 11 for introducing an argon gas and/or a reaction gas thereinto. A gas exhaust system 15 is also connected to the vacuum chamber 11 for removing these gases from the interior of the vacuum chamber 11.

The substrate 13 is supported such that a negative DC voltage with a high-frequency pulse superposed can be applied thereto by means of a voltage applying device 16. The voltage applying device 16 is provided with a DC source 17, a pulse generator 18 and a multiplier 19 and serves to multiply a high-frequency pulse from the pulse generator 18 to a negative DC voltage $V_{dc}$ by the multiplier 19. Thus, a negative voltage with a waveform shown in FIG. 2, becoming positive instantaneously, may be applied to the substrate 13.

Cavities 21 are connected to side windows of the vacuum chamber 11. A waveguide tube 22 is attached to each of these cavities 21, and magnet coils 23, 24 are provided therearound such that an electron cyclotron resonance (ECR) plasma can be generated inside these cavities 21. Explained more in detail, microwaves of 2.45 GHz are introduced from the waveguide tubes 22 into the cavities 21 while magnetic fields are generated by the magnet coils 23 and 24 to generate ECR and to form an active ECR plasma. Such a plasma can be introduced into the vacuum chamber 11 by creating a suitable magnetic field such as a magnetic mirror field or a cusp field inside the vacuum chamber 11 by means of the magnet coils 23 and 24.

If it is desired to produce a magnetic disc for a hard disc memory device by forming protecting films on both surfaces of the substrate 13, a high negative voltage with waveform as shown in FIG. 2 is applied to the substrate 13 while a hydrocarbon gas ($C_nH_m$) or a mixture of a hydrocarbon gas and an inert gas such as Ar is introduced into the vacuum chamber 11. The hydrocarbon gas thus introduced into the vacuum chamber 11 is ionized by the ECR plasma, and carbon and hydrogen ions are deposited onto the substrate 13 to form a thin film. It is to be noted that it is not a constantly negative DC voltage that is applied to the substrate 13 as a carbon film is formed on both surfaces of the substrate 13 by such an ECR-CVD process. In other words, it is not that the substrate is steadily maintained at a negative voltage. As shown in FIG. 2, the voltage of the substrate 13 becomes positive instantaneously to attract electrons, thereby charging its outer surfaces negatively such that the plasma ions can be effectively deposited thereon.

The frequency of the pulse from the pulse generator 18 is determined as follows for such a film-forming process. First, the frequency of the pulse generator 18 is varied while using an ammeter 20, as shown in FIG. 1, to statistically monitor the load current of the voltage applying device 16. The effective current changes as shown in FIG. 3 within the range of 25 kHz to 250 kHz, its value reaching a minimum at two frequency zones a and b. It has been ascertained that the plasma impedance reaches a maximum at these frequency zones and that the plasma is most stable under these conditions.

In summary, a thin film can be formed by causing carbon ions and hydrogen ions to be deposited on the substrate 13 within a stable plasma if the frequency of the high-frequency pulse from the pulse generator 18 is set within either of such frequency zones a and b. With such a choice, it is possible to prevent the generation of particles from the chamber walls caused by an abnormal discharge or the peeling on the substrate surfaces.

Although the invention was described above with reference to only one example, this is not intended to limit the scope of the invention. Many variations and modifications are possible within the scope of this invention. For example, the structure of the device for applying to the substrate 13 a voltage obtained by superposing a high-frequency pulse of a specified frequency on a negative DC voltage is not necessarily limited to be like that of the voltage applying device 16 illustrated in FIG. 1. It also goes without saying that the present invention is not limited to the formation of protective films on both surfaces of the substrate 13 or to the formation of a protective film. The present invention is clearly applicable also to the formation of a film on only one side of the substrate 13 or to the formation of a film of a different kind.

What is claimed is:

1. An apparatus for forming a thin film on a substrate, said apparatus comprising:

a vacuum chamber having said substrate disposed therein;

generating means connected to said vacuum chamber for generating an ECR plasma;

field generating means for generating a specified magnetic field inside said vacuum chamber;

gas supply means for introducing a reaction gas into said vacuum chamber; and voltage applying means for applying a negative DC voltage superposed with a high-frequency pulse with frequency 25–250 kHz and thereby applying a positive voltage to said substrate only instantaneously.

2. The apparatus of claim 1 wherein said gas supply means introduces both said reaction gas and an inert gas into said vacuum chamber.

3. The apparatus of claim 1 further comprising an ammeter for measuring the load current of said voltage applying means.

* * * * *